United States Patent [19]
Wicklund, Jr.

[11] Patent Number: 5,263,029
[45] Date of Patent: Nov. 16, 1993

[54] MEMORY EFFICIENT TOPOLOGICAL CONVERTER ASSEMBLY

[75] Inventor: Joseph B. Wicklund, Jr., Bothell, Wash.

[73] Assignee: Micron Technology, Inc., Boise, Id.

[21] Appl. No.: 893,686

[22] Filed: Jun. 5, 1992

[51] Int. Cl.⁵ ............................................. G06F 11/00
[52] U.S. Cl. .................. 371/21.1; 365/230.01
[58] Field of Search ............. 371/21.1, 21.2, 21.4, 371/24, 27, 71; 365/201, 230.01

[56] References Cited

U.S. PATENT DOCUMENTS 4,757,503  7/1988  Hayes et al. ............... 371/21.1
5,157,664  10/1992  Waite ........................ 371/21.1

Primary Examiner—Vincent P. Canney
Attorney, Agent, or Firm—Stoel Rives Boley Jones & Grey

[57] ABSTRACT

A memory testing assembly (50) for testing a memory device under test ("DUT") includes a row address converter (58) and a column address converter (62). The row and column address converters translate generic row and column count signals into correct row and column address signals that address desired memory cells in a particular DUT. The row and column address converters comprise separate memory arrays, which allow them to employ a relatively small amount of memory bits. The row and column address converters are, however, cross-coupled to provide row and column information signals that are fed back to inputs of the respective column and row address converters. Such feedback allows the memory tester to be able to test DUTs for which some of the row addresses must be known to translate the column addresses and/or some of the column addresses be known to translate the row address. The memory tester writes data into the cells of the DUT and reads and compares the read data with the previously written data. The memory tester includes a data pattern generator (74) that controls the data topology of the data written into cells of the DUT.

20 Claims, 3 Drawing Sheets

MEMORY EFFICIENT TOPOLOGICAL CONVERTER ASSEMBLY

TECHNICAL FIELD

The present invention relates to an address converter assembly for use with a memory tester and, in particular, to a topological address converter assembly that employs feedback between row and column address converters and thereby provides translation flexibility and requires a relatively small number of memory bits.

BACKGROUND OF THE INVENTION

A random access solid state memory device, such as a DRAM, SRAM, VRAM, ROM, EPROM, EEPROM, and others, stores and accesses data at specific cells located in a large array or groups of smaller arrays on the memory device. Such a memory device is referred to herein as a device under test ("DUT"). A memory tester tests the memory cells of a DUT by writing data into the cells and then reading data from the cells to determine whether the data read corresponds to the data written.

Any desired cell, or group of cells, is typically accessed by providing an address to the DUT. Address decoders within the DUT decode the address to enable the desired cell(s) in the array. The address is usually divided into two parts, often called row and column, or X and Y addresses, which are separately decoded. Each of the two address parts specifies a subgroup of the entire array. The desired cell or cells are the intersection of the two subgroups.

In some DUTs, the state representing a logic 1 datum stored in one cell might be the state that represents logic 0 datum stored in some other cell. The specific architecture of the DUT determines which state within each cell represents a logic 0 datum and which state represents logic 1 datum. This architectural definition of logic states is called the data topology of the DUT. For example, a logic 1 may be represented by a high voltage in some cells, and by a low voltage in other cells.

The mapping of the address to the actual physical location of the memory cell(s) can, and usually does, vary among different DUTs. When testing the DUTs, it is often useful to test cells by storing specific data in physically adjoining cells. Regardless of the procedure for testing cells, the memory tester needs to be properly implemented or configured so that memory cells are accurately tested in relation to one another. If the same memory tester is intended for use with several different DUTs, it is important that the address mapping be easily and flexibly configured for each DUT.

A common way for the memory tester to scan through the DUT addresses is to employ two address counters that separately generate addresses for the two DUT address decoders. Referring to FIG. 1, a prior art memory tester 10 tests a one megabit DUT having ten row address bits and ten column address bits. Tester 10 includes a 10-bit row address counter 14 and a 10-bit column address counter 16. The outputs of row counter 14 and column counter 16 are encoded by a row encoder 22 and a column encoder 24, respectively. Row encoder 22 and column encoder 24 operate in complementary manner to the DUT decoding process performed by a DUT row decoder 26 and a DUT column decoder 28 so that the memory cells are scanned in a physical order. Row encoder 22 and column encoder 24 are not reprogrammable. Memory testing with two non-reprogrammable logic encoders works very well with only one specific type of device and, thus, is not very flexible.

It is also common for memory testers to be implemented with a programmable address converter (sometimes called a translator) that is positioned between the row and column address counters and the DUT address input pins. The address converter, which may comprise a fast memory array, translates the counter outputs to activate the proper DUT address inputs. The fast memory array could be either a read-write memory loaded with the proper translation data or a preprogrammed read-only-memory.

For example, in the case of a one-megabit DUT, a converter with twenty input bits and twenty output bits could provide every possible combination of address mapping between the twenty output bits of the row and column address counters and the twenty input bits of the DUT. However, this would require a twenty megabit memory array in the converter to test a one megabit DUT. Additional memory would be required to take into account data topology. Accordingly, using a single memory array to translate the tester addresses into the DUT addresses is not generally practical because it requires too large a converter memory. The large memory is expensive, would increase the size of the tester, and would probably degrade tester performance.

A more practical alternative is to provide two separate address converters. For example, referring to FIG. 2, a prior art memory tester 30 includes respective row and column address converters (or translators) 36 and 38, each having a 1024×10 bit memory array. The 10-bit row count from row counter 14 is applied to row address converter 36, the 10 output bits of which address the row inputs of the DUT. The 10-bit column count from column counter 16 is applied to column address converter 38, the 10 output bits of which address the column inputs of the DUT. The two 1024×10 bit arrays 36 and 38 constitute 20 kilobits. There is, therefore, a thousandfold decrease in required memory bits (20 kilobits compared to 20 megabits) by using two 10-bit arrays 36 and 38, rather than one 20-bit array. For most devices, data topology can be added by merely making each array one bit larger (i.e., 1024×11 bits), and using the extra two bits to determine the data polarity.

A drawback to the use of two separate converters is that they do not provide sufficient flexibility for certain DUTs. For example, certain DUTs require that some of the row addresses be known to translate the column addresses and/or some of the column addresses be known to translate the row address. Sometimes the cells are interleaved, such as the teeth of two combs can be interleaved, so that adjacent cells might alternate between two different rows or columns. In addition, oftentimes the data topology is a Boolean function of several row and column addresses. The Boolean function could be as simple as an exclusive-or of one row and one column address, or it could be a combination of row addresses that select a combination of column addresses to determine data polarity. Both cases require that row and column addresses be used in combination to translate either the row or column addresses.

There is, therefore, a need for a memory tester that is implemented with an address converter that requires minimal memory space, but is sufficiently flexible to be compatible with DUTs of various types.

SUMMARY OF THE INVENTION

It is, therefore, an object of the present invention to provide a memory tester implemented with an address converter that requires minimal memory space.

Another object of this invention is to provide such an address converter that is sufficiently flexible to be compatible with a wide variety of DUTs.

A memory testing assembly for testing a DUT includes a row address converter and a column address converter. The row and column address converters translate generic row and column count signals into correct row and column address signals that address desired memory cells in a particular DUT. The row and column address converters comprise separate memory arrays, which allow them to employ a relatively small amount of memory bits. However, the row and column address converters provide row and column information signals, respectively, which are fed back to inputs of the column and row address converters, respectively. This allows the memory tester to must be able to test DUTs for which some of the row addresses must be known to translate the column addresses and/or some of the column addresses be known to translate the row address. The memory tester writes data into the cells of the DUT and reads and compares the read data with the previously written data. The memory tester includes a data pattern generator that controls the data topology of the data written into cells of the DUT.

Additional objects and advantages of the present invention will be apparent from the following detailed description of a preferred embodiment thereof, which proceeds with reference to the accompanying drawings.

DETAILED DESCRIPTION OF PREFERRED EMBODIMENTS

Figure 1:
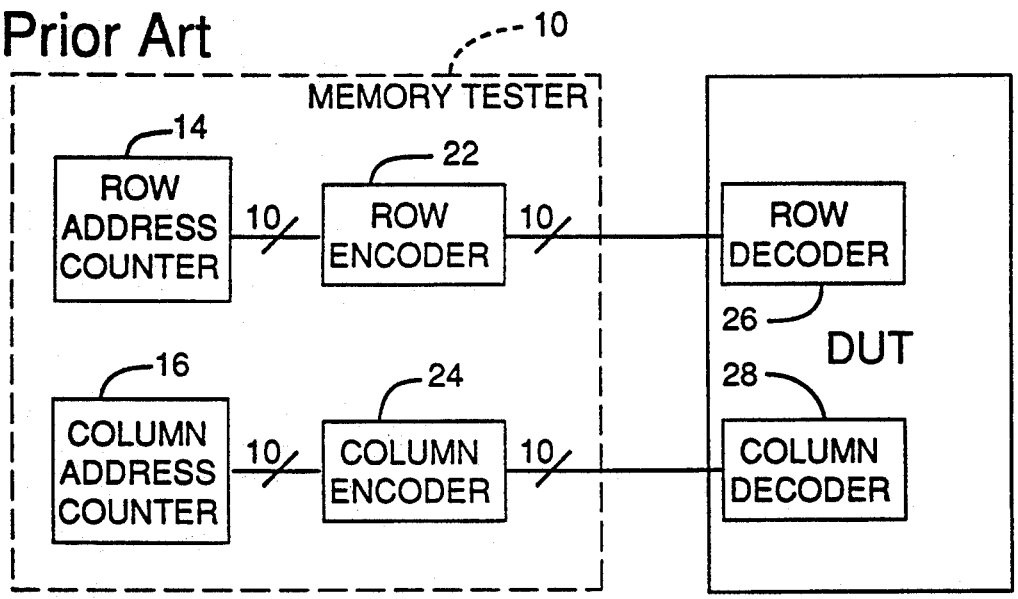
FIG. 1 shows a prior art memory testing assembly with row and column encoders that provide row and column addresses for the DUT.
Figure 2:
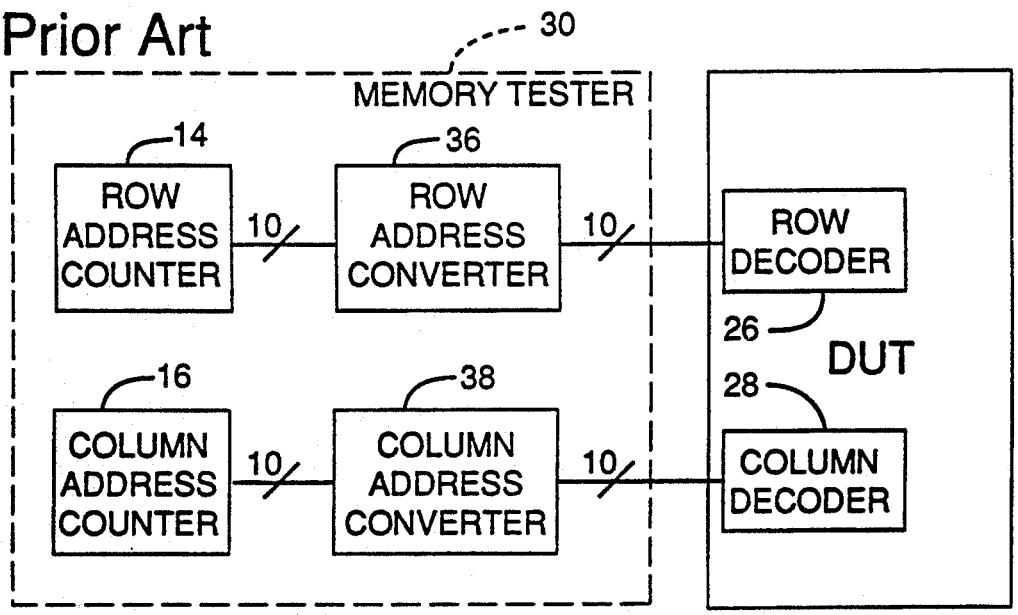
FIG. 2 shows a prior art memory testing assembly with separate reprogrammable address converters positioned between row and column address counters and row and column address inputs for the DUT.
Figure 3:
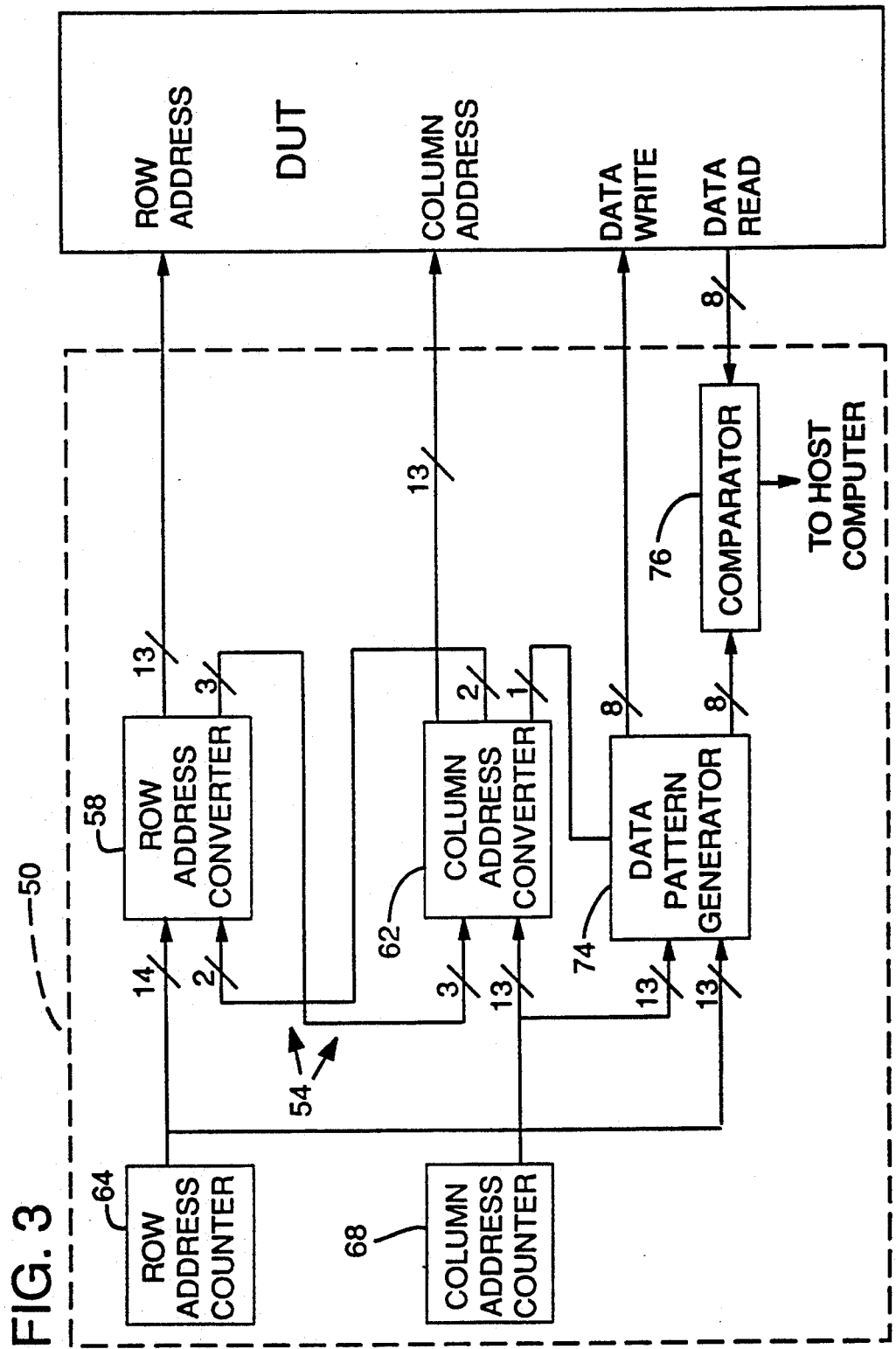
FIG. 3 is a simplified block diagram of a memory tester according to the present invention.

FIG. 3 is a simplified block diagram of a memory tester 50 according to the present invention. Memory tester 50 includes an address converting assembly 54 comprising a row address converter 58 and a column address converter 62. Row and column address converters 58 and 62 provide multiple-bit row and column address signals to a DUT. Row and column address converters 58 and 62 receive respective row and column count signals from respective row and column address counters 64 and 68.

Row and column address converters 58 and 62 are cross-coupled in that a multiple-bit row information signal from row address converter 58 is fed back to inputs of column address converter 62, and a multiple-bit column information signal from column address converter 62 is fed back to inputs of row address converter 58. Consequently, the row address signal provided to the DUT is a function of the row count signal and the column information signal. Likewise, the row address signal provided to the DUT is a function of the row count signal and the column information signal.

The cross-coupled nature of row and column address converters 58 and 62 allows memory tester 50 to be flexible, but allows address converting assembly 54 to use a relatively small amount of memory. Address converting assembly 54 includes eight 64K×4 SRAMs (static random access memory devices), which comprise only 2 megabit of memory, yet can address a 13-bit×13-bit DUT, constituting 64×$2^{20}$ memory locations. An address converter according to the prior art would require a 1728 megabit (=$2^{26}$×26 bits) array to perform the same task. An address converter of that size is completely impractical.

A data pattern generator 74 provides test data that are written into the memory cells addressed by the row and column address signals presented the outputs of the respective row and column address converters 58 and 62. A comparator 76 compares data read from the memory cells with data previously written to the memory cells. The results of the comparison are sent to a host computer.

Figure 4:
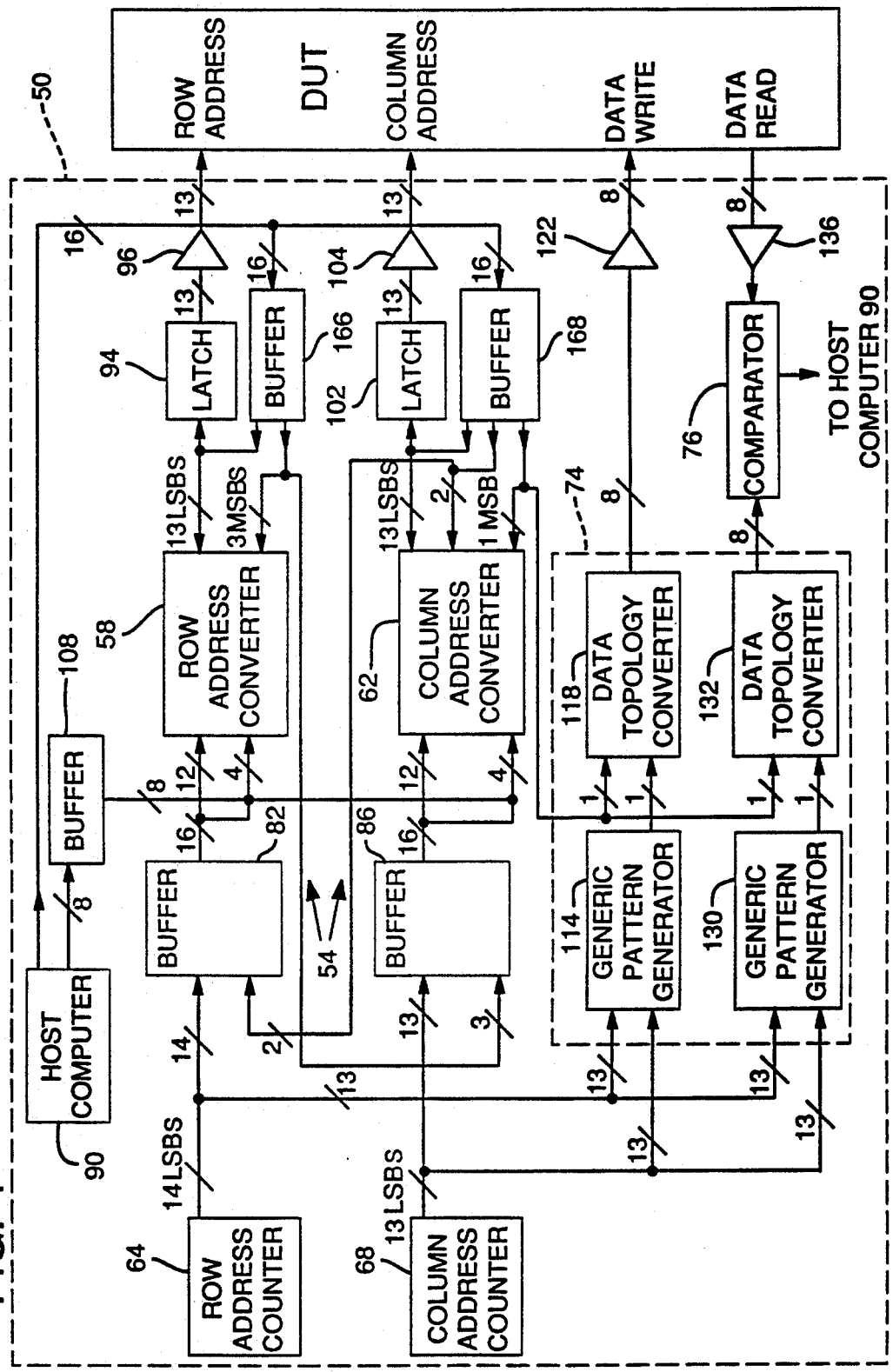
FIG. 4 shows the memory tester of FIG. 3 in a more detailed form.

FIG. 4 shows the memory tester 50 of FIG. 3 in a more detailed form. In the following description, bits of a multiple-bit input or output of a component, or of a multiple-bit signal are denominated B0-B15, where B0 represents the least significant bit (LSB), B1 represents the next LSB, and so forth. Referring to FIG. 4, the row count signal is provided on the fourteen LSBs (B0-B13) of the output of row address counter 64, which are connected to the fourteen LSBs of the 16-bit input of a buffer register 82. The column information signal is provided on bits B13 and B14 of the output of column address converter 62, which are connected to bits B14 and B15, respectively, of the input of buffer register 82. Similarly, the column count signal is provided on the thirteen LSBs (B0-B12) of the output of column address counter 62, which are connected to the thirteen of the 16-bit input of a buffer register 86. The row information signal is provided on bits B13-B15 of the output of row address converter 58, which are connected to bits B13-B15, respectively, of the input of buffer register 86.

In operation, row and column address counters 64 and 68 generate sequentially incremented (or decremented) generic row and column counts under the control of a host computer 90. Except during a data loading mode explained below, buffer registers 82 and 86 pass applied data from their 16-bit inputs to respective ones of their 16-bit outputs, which are connected to 16-bit inputs of respective row and column address converters 58 and 62.

Row and column address converters 58 and 62 each comprise an address and data topological conversion table or tables, logic circuitry, and/or software, that translates the values of the respective row and column count signals into row and column address signals that address correct memory cells in the DUT. Row and column address converters 52 and 62 may each comprise four MT5C2564 SRAMs, which are marketed by Micron Technology, Inc. of Boise, Idaho, the assignee of the present application, that form a 64K×16 RAM array (i.e., a 16 input by 16 output memory array). The four SRAMs act similarly to a look-up table in that they provide a multiple-bit output as a function of an input.

The row address signal is provided on bits B0-B12 of the output of row address converter 58, which are connected to the thirteen input bits of a latch 94. The thirteen output bits of latch 94 are connected to a driver 96, the output of which is connected to the row address inputs of the DUT. Similarly, the column address signal is provided on bits B0-B12 of the output of column address converter 62, which are connected to the thirteen input bits of a latch 102. The thirteen output bits of latch 102 are connected to a driver 104, the output of which is connected to the column address inputs of the DUT. Of course, where desired, the outputs of latches 94 and 102 or drivers 96 and 104 may be jumpered together to drive multiplexed address devices, such as DRAMs (dynamic random access memory devices).

As noted above, row and column address converters 58 and 62 are cross-coupled in that the row information signal of row address converter 58 is fed back through buffer register 86 to bits B13-B15 of the input of column address converter 62, and the column information signal is fed back through buffer register 82 to bits B14-B15 of row address converter 58. The 13-bit row address signal is determined by row address converter 58 based on values of the row count signal provided by row address counter 64 and values of the column information signal. Similarly, the 13-bit column address signal is determined by row address converter 58 based on values of the column count signal provided by column address counter 68 and values of the column information signal.

With a 13-bit row address signal and a 13-bit column address signal, memory tester 50 has the capacity to directly test a DUT with thirteen row and column addresses or $2^{26}$ memory addresses. Of course, memory tester 50 may test DUTs having a smaller number of memory address. In that case, certain of the bits of various inputs and outputs could be ignored. For example, if the DUT had only twelve row address input bits, row address converter 58 could ignore B13 of row address counter 64.

The SRAMs of row and column address converters 58 and 62 are "programmed" during data loading mode to be adapted to the physical address topology and data topology of the particular type of DUT being tested. Depending on the type of DUT, row and column address converters may ignore some or at times all of the bits of the row and column information signals, and may ignore some of the bits of the row and column count signals.

The following is an example of the operation of memory tester 50. Suppose that the 13-bit column address signal provided at the output of column address converter 62 should be twice the value of the 13-bit column count signal (ignoring the carry bit from bit B12) whenever bit B12 of the row count signal has a high voltage. In that case, the data in row address converter 58 would be such that bit B14 of the output of row address converter 58 would have the same voltage as bit B12 of the row count signal received by row address converter 58. Bit B14 of the output of row address converter 58 is one of the bits of the row information signal and is fed back to bit B14 of the input of buffer register 86, the output of which is connected to bit B14 of the input of column address converter 62. The data of the column address converter 62 would be such that the column address signal would be twice the value of bits B0-B12 of the input of column address converter 62 (ignoring the carry bit from bit B12) whenever bit B14 at the input of column address converter 62 has a high voltage.

When the type of DUT being tested changes, the topological conversion data contained in row and column address converters 58 and 62 may need to be changed. Memory tester 50 operates in a run mode and data loading mode. During run mode, memory tester 50 provides correct row and column address signals to the DUT based on the row and column count signals and the row and column information signals. During data loading mode, topological conversion data is loaded by host computer 90 through buffers 166 and 168 into row and column address converters 58 and 62.

Each of buffer registers 82 and 86 comprise four 4-bit registers (not shown), whose inputs correspond to the respective input bits B0-B3, B4-B7, B8-B11, and B12-B15. The 4-bit registers corresponding to input bits B0-B11 are permanently enabled. The 4-bit registers corresponding to input bits B12-B15 are enabled by host computer 90 during run mode, but not during data loading mode. During data loading mode, host computer 90 directly controls bits B0-B11 of row and column address counters 64 and 68, which are then passed to bits B0-B11 of the inputs of row and column address converters 58 and 62 through buffer registers 82 and 86. Input bits B12-B15 of row and column address converters 58 and 62 are provided by buffer register 108, which is enabled only during data loading mode. Four output bits of buffer register 108 are connected to bits B12-B15 of the input of row address converter 58, and the other four output bits of buffer register 108 are connected to bits B12-B15 of column address converter 62.

The purpose for loading bits B12-B15 through buffer register 108 rather than through buffer registers 82 and 86 is to give host computer 90 direct control of all of the inputs to row and column address converters 58 and 62 during the data loading mode. Other schemes could be used for controlling the inputs to the row and column address converters 58 and 62. For example, if buffer register 108 is expanded to 32 bits instead of 8 bits, it could provide all of the address inputs to row and column address converters 58 and 62 during data loading mode by disabling all of the multiple 4-bit registers forming buffer registers 82 and 86.

During data loading mode, host computer 90 sequentially steps through all possible combinations of address inputs to row and column address converters 58 and 62. At each address combination, host computer 90 writes the proper topological data into row address converter 58 through buffer register 166 and into column address converter 62 through buffer register 168. Buffer registers 166 and 168 are enabled only during data loading mode.

Data pattern generator 74 includes a generic pattern generator 114 that can use some or all of the twenty-six LSB outputs from row and column address counters 64 and 68 to generate various patterns of data used to test the DUT. Different test patterns are used to test different DUT devices and to test for different types of failures. The design of test patterns is well known. The output of generic pattern generator 114 represents the desired internal logic state of the memory cell of the DUT for the address provided by address counters 64 and 68. As noted above, in some DUTs, the state representing a logic 1 datum stored in one cell might be the state that represents logic 0 datum stored in another cell. Data topology converter 118 inverts the state of the output of generic pattern generator 114 when appropriate so that a particular logic state on the output of generic pattern generator 114 results in the same logic state in all cells of the DUT where the state at the output of generic pattern generator 114 is to be stored.

Data topology converter 118 includes two inputs, one of which is connected to the single-bit output of generic pattern generator 114 and the other of which is connected to the most significant bit (MSB) (B15) of column address converter 62. When the MSB of column address converter 62 has a first state (e.g., a high voltage), data topology converter 118 does not invert the output of generic pattern generator 114. Conversely, when B15 of column address converter 62 has a second state (e.g. a low voltage), data topology converter 118 inverts the output of generic pattern generator 114. The non-inverted or inverted output of generic pattern generator 114 appears at output bit B0 of data topology converter 118. Row and column address converters 58 and 62 contain tables that incorporate the data polarity topology information so that bit B15 of column address converter 62 depends on the column count signal and the row informational signal.

Data topology converter 118 has an 8-bit output that is connected to a DUT driver 122, the output of which is connected to the data input bits of the DUT. The number of bits of the output of data topology converter 118 is arbitrary, but should be at least as many as the number of bits contained in the memory cells addressed by the row and column address signals. Of course, the DUT may have less than eight data bits per address, and data topology converter 118 may have more than eight output bits. As noted above, the non-inverted or inverted output of generic pattern generator 114 appears at output bit B0 of data topology converter 118. Host computer 90 controls whether individual ones of the other output bits of data topology converter 118, bits B1-B7 in this example, are either direct copies or inverted copies of bit B0.

Generic pattern generator 130 and data topology converter 132 are similar to generic pattern generator 114 and data topology converter 118. The following example illustrates the operation of generic pattern generators 114 and 130 and data topology converters 118 and 132. In the example, the DUT performs a read modify write procedure during which a datum is read from and then written to a cell in rapid succession. Referring to the example, in a first pass, row and column counters 64 and 68 count throughout a range that will cause every memory cell in the DUT to be addressed. In response to the row and column count signals, and the MSB of column address converter 62, generic pattern generator 114 and data topology converter 118 write a logic 0 datum into each cell of the DUT. (Because different cells employ different states to represent a logic 0 datum, the outputs of DUT driver 122 will vary between a high and a low state depending on which cells are being addressed.)

During a second pass, row and column counter 64 and 68 repeat the same counting range that occurred during the first pass. As each cell is addressed, the datum in the cell is read and then a logic 1 datum is written into the cell. (In the case where the DUT has multiple cells per address, each cell with the same address is read from simultaneously and written to simultaneously.) The data read is compared by comparator 76 with the data at the output of data topology converter 132. The data of the output of data topology converter 132 during the second pass are equal to the data of the output of data topology converter 118 at the time the cells at the particular address were being written to during the first pass. The output of comparator 76 is stored in memory (not shown) and later read by host computer 90. Ordinarily, the DUT is defective if the output of a cell and an output of data topology converter 132 are not equal.

During the third pass, row and column counters 64 and 68 repeat the same counting range that occurred during the first and second passes. As each cell is addressed, the datum in the cell is read and then a datum according to a pattern is written into the cell. For example, the pattern may be to write logic 0 data into odd numbered rows and a logic 1 data into even numbered rows, creating stripes. (Stripes are used to ensure adjacent cells are not shorted together.) The data read is compared with the output of data topology converter 132. During a fourth pass, the data written during the third pass is read and data is written according to another pattern (for example, the opposite of the data written during the third pass). Additional passes may be employed to read and write additional well known patterns to ensure the DUT performs adequately.

In the case where the DUT may not perform a read modify write procedure, separate passes are used to read from and write to cells of the DUT. In the case where the DUT cannot be written to (e.g., the DUT is a ROM), the output of data topology converter 132 should match the expected data from the DUT. In that case, the generic pattern generator would be "preprogrammed" to match the expected data of the DUT.

There is a tradeoff between flexibility and converter size and cost with the number of bits in the row and column information signals. However, it is believed that three bits from row address converter 58 and two bits from column address converter 62 provide sufficient flexibility to handle most DUTs. Controlling the data topology from a bit of column address converter 62 rather than from row address converter 58 is arbitrary. Most of the choices of the preferred embodiment are somewhat arbitrary and chosen for convenience. With these choices, row and column address converters 58 and 62 are easily implemented with four 64K×4 SRAMs, providing a 16-input by 16-output memory array.

As described above, new sets of data are loaded into row and address converters 58 and 62 by host computer 90. Other options include adding one or more extra inputs to row and column address converters 58 and 62 that can be set by operator switches or control of computer 90 to effectively switch between sections of the converter array to accommodate different DUTs. For example, if 256K×4 memory devices were used instead of 64K×4 memory devices, then the two extra inputs to each array would allow selection of one of four topologies preloaded into the row and column converters. If the row and column converters employed some form of read-only-memories with preloaded data rather than SRAMs, it would be particularly desirable to include several preloaded data selections.

It will be appreciated that the various components shown in FIG. 4 are controlled by host computer 90. However, for clarity, control buses between the components and host computer 90 are omitted form FIG. 4. Also, various components which are standard and well known have been omitted from FIG. 4.

Host computer 90 may direct data topology converters 118 and 132 (through conductors not shown) to selectively invert any of the data lines relative to other of the data lines. For example, in order to determine whether cells within the same address are shorted together, host computer 80 may direct data topology converters 118 and 132 invert every other of the eight data lines.

Although row and column addresses or X and Y addresses are mentioned in the present disclosure, the invention is applicable to any case of two or more address decoder sections used to specify the cell location within a larger array. A generalized address nomenclature includes a first-dimension address and a second-dimension address. Under this generalized nomenclature, either the first-dimension address or the second-dimension address could represent a row or a column address. The present invention is not limited to only two dimensions, or to only row and column addresses. The principles of the invention may be employed in testing DUTs having three or more types of addresses.

The details of the components described in connection with FIG. 4 are provided only by way of example. Row and column address counters 64 and 68 need not be discrete counters. Buffer registers 82 and 86 could comprise a single 16-bit register or sixteen single bit registers. Row and column address converters 58 and 62 could be constructed from forms of memory and logic other than SRAMs. Latches 94 and 102 are not necessary in all cases. One or more of the three bits from row address converter 58 can be used in data polarity mapping. In the preferred embodiment, row address converter 58 provides the row address signal and the row information signal on different output bits. Similarly, column address converter 62 provides the column address signal and the column information signal on different output bits. Alternatively, the row information signal could be provided on some of the output bits on which the row address signal is provided. Similarly, the column information signal could be provided on some of the output bits on which the column address signal is provided.

The invention is not limited to testing DUTs in which logic states are represented as low and high voltages. The principles of the invention could be applied to a case in which DUTs represent logic states by other first and second states such as low or high resistance, low or high current, or a first or second magnetic polarity.

Those having skill in the art will appreciate that many changes may be made in the above-identified details of a preferred embodiment of the present invention without departing from the underlying principles thereof. The scope of the present invention should, therefore, be determined only by the following claims.

What is claimed is:

1. A memory testing system that tests cells of a memory device under test (DUT), comprising:
    address counting means for providing a row count signal and a column count signal;
    row address converting means receiving the row count signal for providing a correct row address signal for the DUT and for providing a row information signal; and
    column address converting means receiving the column count signal and the row information signal for providing a correct column address signal for the DUT based on values of the column count signal and the row information signal, and for providing a column information signal, the row address converting means receiving the column information signal and providing the correct row address signal based on values of the row count signal and the column information signal.

2. The system of claim 1 further comprising means for writing data into and reading data from the cells of the DUT, and means for comparing the data written into and read from the cells of the DUT.

3. The system of claim 1 further comprising data pattern generating means for writing data having particular logic states into the cells of the DUT, the data pattern generating means considering whether individual ones of the cells represent the logic states with a first or a second state.

4. The system of claim 3 in which the data pattern generating means is responsive to a signal from the column address converting means.

5. The system of claim 3 in which the data pattern generating means is responsive to a signal from the row address converting means.

6. The system of claim 3 further comprising means for reading data from the cells of the DUT, and means for comparing the data written into and read from the cells of the DUT.

7. The system of claim 1 in which the row and column address converting means each comprise an SRAM memory containing at least one SRAM device.

8. The system of claim 1 in which the row information signal comprises multiple bits.

9. The system of claim 1 in which the column information signal comprises multiple bits.

10. The system of claim 1 in which the row and column address converting means each contain multiple sets of data each of which are designed to translate respective row and column count signals and respective row and column information signals for a specific type of DUT.

11. The system of claim 10 in which the row and column address converting means each contain at least one input used for selecting among the programs.

12. The system of claim 1 in which the row and column information signals are applied to buffers positioned between the respective address counting means and the column and row address converting means, rather than directly to the column and row address converting means.

13. The system of claim 1 in which the system operates in a run mode and a data loading mode such that during the run mode, the row and column address converting means provides the correct row and column address signals for the DUT, and during the data loading mode, a host computer directs loading of topological conversion data into the row and column address converting means.

14. A memory testing system that tests cells of a memory device under test (DUT), comprising:
    address counting means for producing a first-dimension count signal and a second-dimension count signal;
    first-dimension address converting means receiving the first-dimension count signal for providing a correct first-dimension address signal for the DUT and for providing a first-dimension information signal; and
    second-dimension address converting means receiving the second-dimension count signal and the first-dimension information signal for providing a correct second-dimension address signal for the DUT based on values of the second-dimension count signal and the first-dimension information signal.

15. The system of claim 14 in which the second-dimension address converting means produce a second-dimension information signal, and the first-dimension address converting means provides the correct first-dimension address signal based on values of the first-dimension count signal and the second-dimension information signal.

16. The system of claim 14 in the first-dimension represents columns of the DUT and the second-dimension represents rows of the DUT.

17. The system of claim 14 further comprising data pattern generating means for writing data having particular logic states into the cells of the DUT, the data pattern generating means considering whether individual ones of the cells represent the logic states with a first or a second state.

18. The system of claim 17 in which the data pattern generating means is responsive to a signal from the first-dimension address converting means.

19. The system of claim 17 in which the data pattern generating means is responsive to a signal from the second-dimension address converting means.

20. The system of claim 14 further comprising means for writing data into and reading data from the cells of the DUT, and means for comparing the data written into and read from the cells of the DUT.

* * * * *